United States Patent
Zhong et al.

(10) Patent No.: US 9,846,793 B2
(45) Date of Patent: Dec. 19, 2017

(54) METHOD AND DEVICE FOR READING RFID/UHF LABEL BASED ON AUDIO INTERFACE

(71) Applicant: XIAMEN INNOV ELECTRONICS TECH CO., LTD., Fujian (CN)

(72) Inventors: Zhiming Zhong, Fujian (CN); Jinhua Li, Fujian (CN); Youbin Zuo, Fujian (CN)

(73) Assignee: XIAMEN INNOV ELECTRONICS TECH CO., LTD., Fujian (CN)

( * ) Notice: Subject to any disclaimer, the term of this patent is extended or adjusted under 35 U.S.C. 154(b) by 0 days.

(21) Appl. No.: 14/889,073

(22) PCT Filed: Aug. 8, 2014

(86) PCT No.: PCT/CN2014/084001
§ 371 (c)(1),
(2) Date: Nov. 4, 2015

(87) PCT Pub. No.: WO2015/024462
PCT Pub. Date: Feb. 26, 2015

(65) Prior Publication Data
US 2016/0078255 A1 Mar. 17, 2016

(30) Foreign Application Priority Data
Aug. 22, 2013 (CN) .......................... 2013 1 0368967

(51) Int. Cl.
*G06K 7/00* (2006.01)
*H01L 31/12* (2006.01)
(Continued)

(52) U.S. Cl.
CPC ............. *G06K 7/0004* (2013.01); *G06K 7/00* (2013.01); *G06K 7/10* (2013.01); *G06K 19/0723* (2013.01); *H01L 31/12* (2013.01); *H01L 31/18* (2013.01)

(58) Field of Classification Search
CPC .......... G06K 7/00; G06K 7/0004; G06K 7/10; G06K 7/0008; G06K 7/10366;
(Continued)

(56) References Cited

U.S. PATENT DOCUMENTS

| 4,904,853 A * | 2/1990 | Yokokawa | ........... | G06K 7/0008 235/462.01 |
| 2015/0341074 A1* | 11/2015 | Saukko | .................... | H01Q 1/52 455/575.5 |

FOREIGN PATENT DOCUMENTS

| CN | 102857631 A | 1/2013 |
| CN | 103514425 A | 1/2014 |
| CN | 203422748 U | 2/2014 |

OTHER PUBLICATIONS

International Search Report dated Nov. 18, 2014, issued to International Application No. PCT/CN2014/084001.

* cited by examiner

*Primary Examiner* — Dionne H Pendleton
(74) *Attorney, Agent, or Firm* — Stein IP, LLC

(57) ABSTRACT

A method and a device for reading RFID/UHF label based on an audio interface are disclosed. According to the method, a built-in software module in an electronic device converts a first digital signal into an analog signal capable of being transmitted via the audio interface; the analog signal received by the audio interface is converted into a second digital signal via an audio communication circuit; then the RFID/UHF controller for digital signal control reads information from the RFID/UHF label; the RFID/UHF controller (Continued)

modulates and sends signals of a plurality of different frequency points, and the signal of every frequency point forms a signal channel. Compared with the prior art, the present invention can keep long-distance communication between the electronic device and a plurality of labels.

6 Claims, 3 Drawing Sheets

(51) Int. Cl.
      *H01L 31/18*       (2006.01)
      *G06K 19/07*       (2006.01)
      *G06K 7/10*       (2006.01)

(58) Field of Classification Search
CPC ........... G06K 19/0723; G06K 19/0727; G06K 19/07783; G06K 7/10237; G06K 7/10356; G06K 7/10386; G06K 19/077; G06K 19/07786; G06K 7/10009; G06K 7/10207; G06K 19/0726; G06K 19/07749; G06K 19/0739; G06K 19/07767; H01L 31/12; H01L 31/18

See application file for complete search history.

METHOD AND DEVICE FOR READING RFID/UHF LABEL BASED ON AUDIO INTERFACE

CROSS-REFERENCE TO RELATED APPLICATIONS

This application is a national stage of International Application No. PCT/CN2014/084001, filed Aug. 8, 2014, which claims the benefit of priority to Chinese Application No. 201310368967.0, filed Aug. 22, 2013, in the State Intellectual Property Office, the disclosures of which are incorporated herein by reference.

TECHNICAL FIELD

The present invention relates to a method and a device for reading the RFID/UHF label based on an audio interface.

DESCRIPTION OF THE RELATED ART

Radio Frequency IDentification (RFID) is a wireless communication technology, capable of identifying a specific target and reading related data through radio electric signals, without establishing mechanical or optical contact between the identification system and the specific target.

Ultra High Frequency (UHF) refers to radio waves with a frequency of 300~3000 MHz and a wavelength of 1 m~1 dm. The radio wave in this wave band is also called decimetric wave.

In the prior art, the identification of the RFID labs in batches usually aims at the near-distance radio communication of RFID/NFC, usually completing the data exchange at a single frequency point in a radius of 10 cm and only reading the information of a single label in a short distance. Thus, the reading scope and reading efficiency of the label information are greatly affected, which indeed needs improvement.

BRIEF SUMMARY OF THE INVENTION

The present invention solves the technical problem of providing a method for reading RFID/UHF label based on an audio interface to read the information of a plurality of labels remotely so as to overcome the defect in the prior art that only the information of a single label can be read in a short distance.

To fulfill the above objective, the present invention employs the following solution:

A method for reading RFID/UHF label based on an audio interface is carried out as follows:

Step S110: An electronic device sends a first digital signal in a triggering mode; the first digital signal is converted by a software module built-in the electronic device into an analogue signal; the analogue signal is sent to an external read-write module through a left/right earphone channel of an audio interface of the electronic device.

Step S120: The audio communication circuit in the read-write module converts the analogue signal sent by the electronic device into a square wave signal; the square wave signal as a received baseband signal is input into the MCU; the MCU decodes the square wave signal to recover the digital signal sent via the audio interface of the electronic device so as to generate a second digital signal;

Step S130: The second digital signal is transmitted to a RFID/UHF controller via a communication interface; the RFID/UHF controller enables an internal anti-collision programming algorithm to modulate and send signals of a plurality of different frequency points at the same time, wherein the signal of each frequency point forms a signal channel.

Step S140: The RFID/UHF controller is electrically connected to a power amplifier PA; the power amplifier PA amplifies the signals of the above mentioned plurality of different frequency points; then, an antenna transmitting and receiving module with matched impedance sends the amplified signals to form an electromagnetic field and receives radio frequency signals fed back through a plurality of labels in the electromagnetic field.

Step S150: The plurality of radio frequency signals fed back by the above labels are amplified by the power amplifier PA and then transmitted to the RFID/UHF controller; the anti-collision programming algorithm in the controller identifies and confirms the plurality of radio frequency signals transmitted at the same time and then transmits those radio frequency signals to the MCU via the communication interface.

Step S160: The MCU encodes the plurality of label data fed back by the RFID/UHF controller and generates a baseband signal; the generated baseband signal is converted by the audio communication circuit into an audio analogue signal; and the audio analogue signal is transmitted into the electronic device via a microphone channel in the audio interface.

Step S170: The audio signal received in the audio interface of the electronic device is transmitted into the built-in software module, and the built-in software module encodes the audio signal to obtain the RFID/UHF label information read by the RFID/UHF controller.

To solve the above technical problem, the present invention also provides another technical solution:

A device for reading RFID/UHF label based on an audio interface includes an audio communication circuit, an MCU, a RFID/UHF controller, a power amplifier and an antenna transmitting and receiving module; the audio communication circuit is connected with the audio interface of the electronic device; the audio communication circuit is connected with the RFID/UHF controller through the MCU; the power amplifier located between the RFID/UHF controller and the antenna transmitting and receiving module to amplify signals; a plurality of communication channels are disposed between the RFID/UHF controller and the power amplifier; the audio communication circuit is used for receiving an audio analogue signal generated by the electronic device and transmitted via a left/right earphone channel of the audio interface, and converts the received audio analogue signal into a digital signal; the RFID/UHF controller is used for receiving the digital signal, modulating and transmitting signals of a plurality of different frequency points through an internal anti-collision programming algorithm, wherein the signal of every frequency point forms a signal channel; the power amplifier is used for amplifying the signals of the above mentioned plurality of different frequency points, and then antenna transmitting and receiving module with the matched impedance sends the amplified signal; the antenna transmitting and receiving module receives radio frequency signals fed back through a plurality of labels in the electromagnetic field, and the power amplifier amplifies and transmits the radio frequency signals to the RFID/UHF controller.

The present invention has the following beneficial effects: Different from the prior art where the short-distance radio communication of RFID/NFC can only realize single-frequency data exchange in a short distance, the method and device for reading the RFID/UHF label based on the audio interface of the present invention employ the RFID/UHF controller to modulate and send the signals of the plurality of different frequency points at the same time, and the signal of every frequency point forms a signal channel, thus realizing multi-channel data exchange; then, the power amplifier and the antenna transmitting and receiving module are employed to communicate with the plurality of RFID labels, thus greatly prolonging the communication distance between the electronic device and the plurality of labels.

DESCRIPTION OF MARKS

1. Smart phone; 2. Audio communication circuit; 3. MCU; 4. RFID/UHF controller 5. Power amplifier 6. Antenna transmitting and receiving module. 7. RFID label.

DETAILED DESCRIPTION OF THE INVENTION

The technical contents, fulfilled objective and effects of the present invention are described in detail with reference to the embodiments and attached drawings.

EXPLANATION OF TERMS

MIC: Microphone
MIC_GND: grounding

The key concept of the present invention is: The RFID/UHF controller generates the channels of a plurality of different frequency points and the power amplifier amplifies the signals, thus realizing multi-channel long-distance data exchange.

Figure 1:
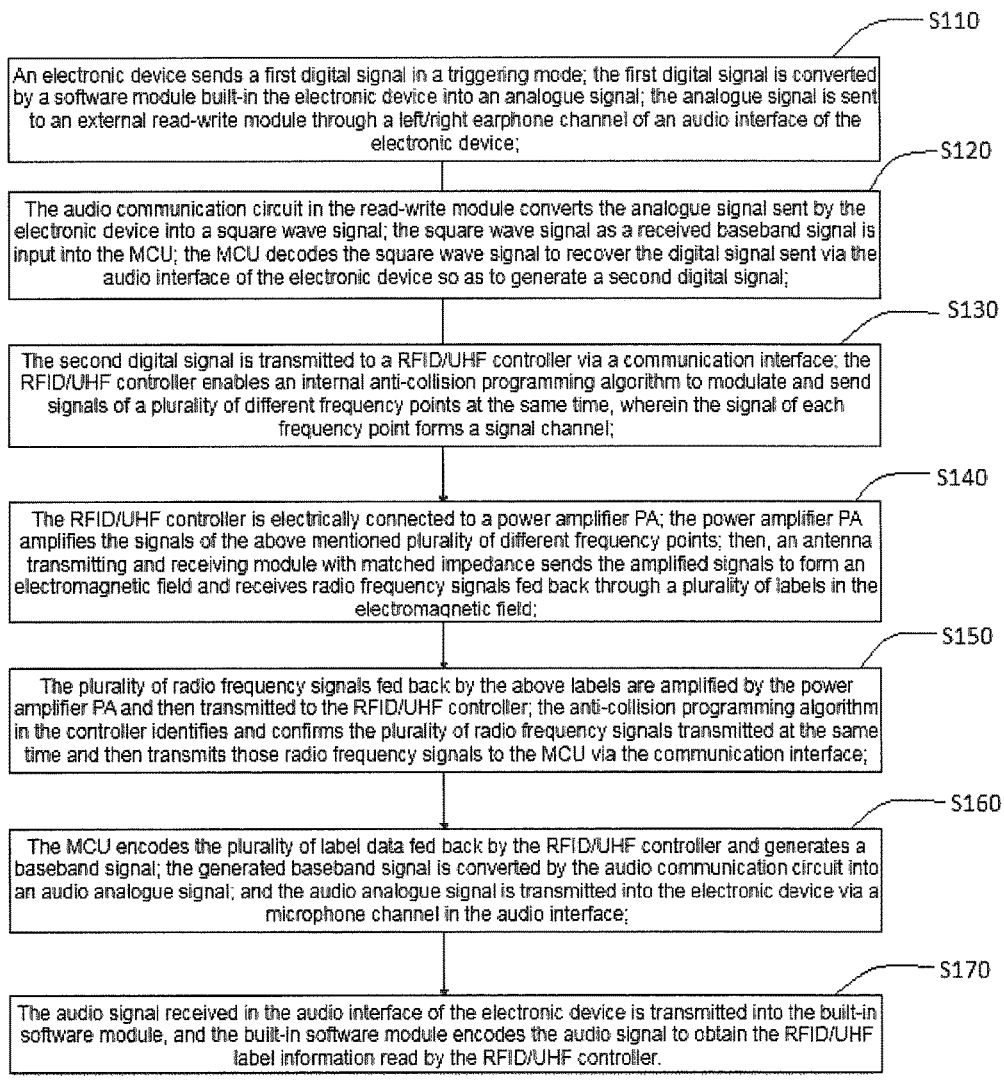
FIG. 1 is a flowchart of a method for reading RFID/UHF label based on an audio interface in an embodiment of the present invention.
Figure 2:
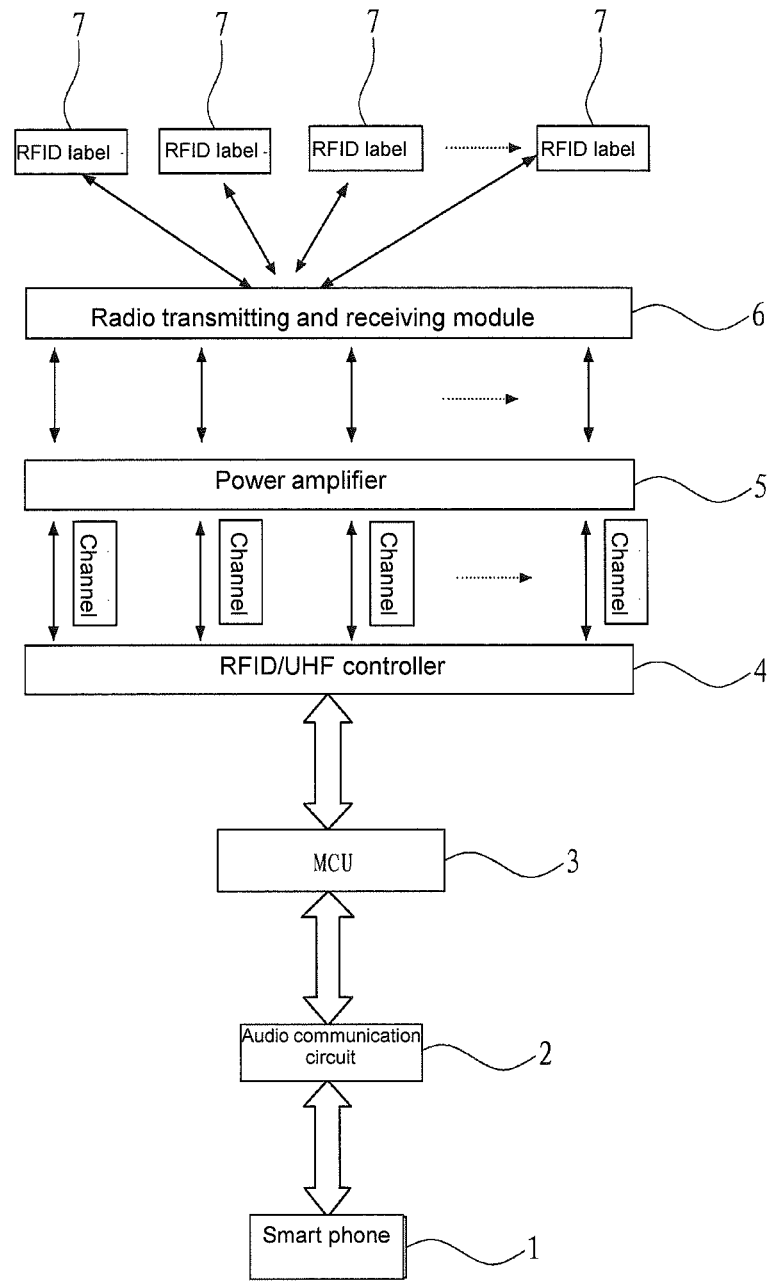
FIG. 2 is a schematic view of a method for reading RFID/UHF label based on an audio interface in an embodiment of the present invention.

Refer to FIG. 1 and FIG. 2. A method for reading RFID/UHF label based on an audio interface is carried out as follows:

Step S110: An electronic device sends a first digital signal in a triggering mode; the first digital signal is converted by a software module built-in the electronic device into an analogue signal; the analogue signal is sent to an external read-write module through a left/right earphone channel of an audio interface of the electronic device.

Step S120: The audio communication circuit 2 in the read-write module converts the analogue signal sent by the electronic device into a square wave signal; the square wave signal as a received baseband signal is input into the MCU 3; the MCU 3 decodes the square wave signal to recover the digital signal sent via the audio interface of the electronic device so as to generate a second digital signal;

Step S130: The second digital signal is transmitted to a RFID/UHF controller 4 via a communication interface; the RFID/UHF controller 4 enables an internal anti-collision programming algorithm to modulate and send signals of a plurality of different frequency points, wherein the signal of each frequency point forms a signal channel.

Step S140: The RFID/UHF controller 4 is electrically connected to a power amplifier PA 5; the power amplifier PA 5 amplifies the signals of the above mentioned plurality of different frequency points; then, an antenna transmitting and receiving module 6 with matched impedance sends the amplified signals to form an electromagnetic field and receives radio frequency signals fed back through a plurality of labels in the electromagnetic field.

Step S150: The plurality of radio frequency signals fed back by the above labels are amplified by the power amplifier PA 5 and then transmitted to the RFID/UHF controller; the anti-collision programming algorithm in the controller identifies and confirms the plurality of radio frequency signals transmitted at the same time and then transmits those radio frequency signals to the MCU 3 via the communication interface.

Step S160: The MCU 3 encodes the plurality of label data fed back by the RFID/UHF controller 4 and generates a baseband signal; the generated baseband signal is converted by the audio communication circuit 2 into an audio analogue signal; and the audio analogue signal is transmitted into the electronic device via a microphone channel in the audio interface.

Step S170: The audio signal received in the audio interface of the electronic device is transmitted into the built-in software module, and the built-in software module encodes the audio signal to obtain the RFID/UHF label information read by the RFID/UHF controller 4.

Wherein, the built-in software module is audio processing software in the electronic device, and the audio processing software operates in the audio circuit for converting the digital information into the analogue audio signal.

The internal anti-collision programming algorithm is a time slot random anti-collision algorithm of ISO18000-6C standard.

From the above description, it can be known that the present invention has the following beneficial effects: according to the method for reading the RFID/UHF label based on the audio interface of the present invention, the RFID/UHF controller 4 is employed to modulate and send the signals of the plurality of different frequency points at the same time, and the signal of every frequency point forms a signal channel; then, the power amplifier 5 and the antenna transmitting and receiving module 6 are employed to communicate with the plurality of RFID labels 7, thus greatly prolonging the communication distance between the electronic device and the plurality of labels.

Furthermore, in this embodiment, the electronic device is a smart phone 1, a tablet PC or a PC machine with an audio interface.

The present invention also provides another technical solution:

A device for reading RFID/UHF label based on an audio frequency includes an audio communication circuit 2, an MCU 3, a RFID/UHF controller 4, a power amplifier 5, and an antenna transmitting and receiving module 6, the audio communication circuit 2 is connected with the audio interface of the electronic device; the audio communication circuit 2 is connected with the RFID/UHF controller 4 via the MCU3; the power amplifier 5 is located between the RIFD/UHF controller and the antenna transmitting and receiving module 6 to amplify the signal; a plurality of communication channels are disposed between the RFID/UHF controller 4 and the power amplifier 5.

The audio communication circuit 2 is used for receiving an audio analogue signal generated by the electronic device and transmitted via a left/right earphone channel of the audio interface, and converts the received audio analogue signal into a digital signal;

The RFID/UHF controller 4 is used for receiving the digital signal, modulating and transmitting signals of a plurality of different frequency points through an internal anti-collision programming algorithm, wherein the signal of every frequency point forms a signal channel;

The power amplifier 5 is used for amplifying the signals of the above mentioned plurality of different frequency points, and then antenna transmitting and receiving module 6 with the matched impedance sends the amplified signal;

The antenna transmitting and receiving module 6 receives radio frequency signals fed back through a plurality of labels in the electromagnetic field, and the power amplifier 5 amplifies and transmits the radio frequency signals to the RFID/UHF controller 4. Furthermore, the antenna transmitting and receiving module 6 has a built-in impedance matching circuit.

From the above description, it can be known that the present invention has the following beneficial effects: According to the device for reading the RFID/UHF label based on the audio interface of the present invention, the RFID/UHF controller 4 is employed to modulate and send the signals of the plurality of different frequency points at the same time, and the signal of every frequency point forms a signal channel; then, the power amplifier 5 and the antenna transmitting and receiving module 6 are employed to communicate with the plurality of RFID labels 7, thus greatly prolonging the communication distance between the electronic device and the plurality of labels.

Figure 3:
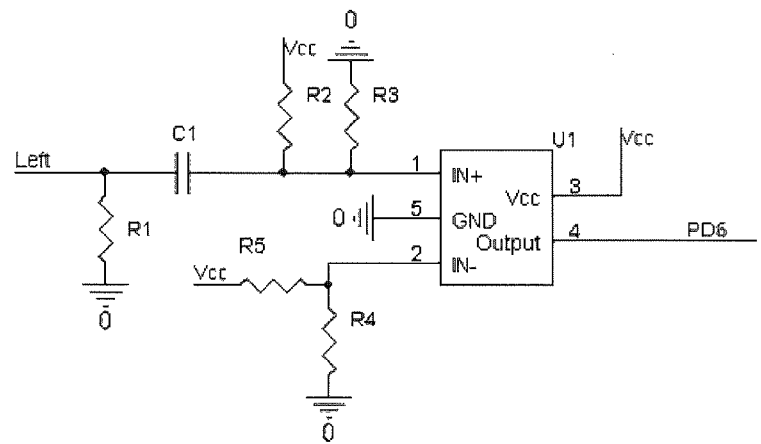
FIG. 3 is a circuit diagram of an audio communication circuit of a device for reading RFID/UHF label based on an audio interface in an embodiment of the present invention.

Furthermore, please refer to FIG. 3. In one embodiment, the audio communication circuit 2 includes a first resistor (R1), a first capacitor (C), a second resistor (R2), a third resistor (R3), a fourth resistor (R4), a fifth resistor (R5) and a comparator (U1).

One end of the first resistor is connected to the audio interface of the electronic device, while the other end of the first resistor is connected to one end of the first capacitor; the second resistor and the third resistor are connected in series between the positive electrode of an internal DC power source of the device and the ground, while the other end of the first capacitor is connected to the public end of the second resistor and third resistor and connected to an input end of the comparator;

The fourth resistor and the fifth resistor are connected in series between the positive electrode of the internal DC power source of the device and the ground, while the public point of the fourth resistor and fifth resistor is connected to the other input end of the comparator;

The output end of the comparator is connected to the MCU 3.

In this embodiment, the electronic device may be a smart phone 1, a tablet PC, etc. A pull-down resistor (namely the first resistor) R1 pulls the DC level in the audio analogue signal sent by the electronic device to 0; the capacitor (namely the first capacitor) C1 filters the DC component in the signal, then the resistor R2 and the resistor R3 (namely the second resistor and third resistor) adjusts the level V+ of the signal to ½ of the bias voltage Vcc and transmits the voltage to the IN+ pin of the comparator U1; the level V− modulated by the resistor R4 and the resistor R5 (the fourth resistor and the fifth resistor) is transmitted to the IN− pin of the comparator U1; and through comparing the level V+ with V−, the comparator U1 generates a square wave signal.

Figure 4:
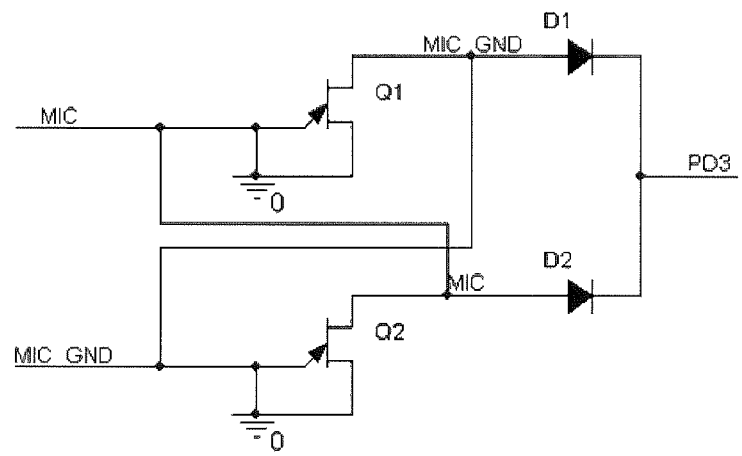
FIG. 4 is a circuit diagram of an audio communication circuit of a device for reading RFID/UHF label based on an audio interface in another embodiment of the present invention.

Furthermore, please refer to FIG. 4. In one embodiment, the audio communication circuit 2 also comprises a first MOS tube (Q1), a second MOS tube (Q2), a first diode (D1) and a second diode (D2).

The first MOS tube and the second MOS tube are N-channel MOS tubes.

The grid electrode of the first MOS tube is connected to the MIC signal wire of the audio interface of the electronic device, and the drain electrode of the first MOS tube is connected to the positive electrode of the first diode.

The grid electrode of the second MOS tube is connected to the MIC-GND signal wire of the audio interface of the electronic device, and the drain electrode of the second MOS tube is connected to the positive electrode of the second diode.

The negative electrodes of the first diode and the second diode are connected to the MCU3.

The drain electrode of the first MOS tube is connected to the MIC-GND signal wire of the audio interface of the electronic device, and the drain electrode of the second MOS tube is connected to the MIC signal wire of the audio interface of the electronic device.

In this embodiment, the MIC of the internal audio interface of the electronic device such as the smart phone 1 generates a high level to the MIC (or MIC_GND) of the audio interface of the device such that the tube Q1 (or Q2) is switched on while Q2 (or Q1) is off and that the diode D1 (or D2) is switched off while D2 (or D1) is on; the baseband signal generated by the MCU3 is converted into the audio analogue signal via the diode D2 and transmitted to the smart phone 1 via the MIC (or MIC_GND) channel. This embodiment is on the basis that the device for reading RFID/UHF label with the audio interface can be compatible with the international and national audio interface standards.

The device for reading RFID/UHF label based on the audio interface of the present invention can be used in the fields of checking of the fixed assets, automatic charging or car identification.

For application of the present invention in the fixed assets checking, articles (such as the PC, clothes) are affixed with electronic labels; the audio interface of the smart phone is plugged with the device for reading the RFID/UHF label based on the audio interface of the present invention; the device can read a plurality of electronic labels within a certain range at the same time, transmit the read electronic label to the smart phone, so the smart phone can read the EPC numbers of those electronic labels to identify the specific articles of this kind of fixed assets.

In conclusion, the method and device for reading the RFID/UHF labels based on the audio interface provided by the present invention can realize data exchange with a plurality of RFID/UHF labels at the same time, can also greatly prolong the effective distance of data exchange and can be compatible with the international and national audio interface standards.

The above are only a few of the embodiments of the present invention and shall not be regarded as to limit the present invention. Any equivalent modifications made on the basis of the description and attached drawings of the present invention, or director or indirect application to the related fields, shall fall within the protective scope of the present invention.

What is claimed is:

1. A method for reading a radio frequency identification ultra-high frequency (RFID/UHF) label based on an audio interface, comprising the following:

sending a first digital signal in a triggering mode by an electronic device; converting the first digital signal by a software module built-in the electronic device into an analogue signal; sending the analogue signal to an external read-write module through a left/right earphone channel of an audio interface of the electronic device;

converting the analogue signal sent by the electronic device into a square wave signal by an audio communication circuit in the read-write module; inputting the square wave signal as a received baseband signal into a microcontroller (MCU); decoding the square wave signal by the MCU to recover the digital signal sent via the audio interface of the electronic device so as to generate a second digital signal;

transmitting the second digital signal to a RFID/UHF controller via a communication interface; enabling an internal anti-collision programming algorithm by the RFID/UHF controller to modulate and send signals of a plurality of different frequency points, wherein the signal of each frequency point forms a signal channel;

electrically connecting the RFID/UHF controller to a power amplifier PA; amplifying the signals of the above mentioned plurality of different frequency points by a power amplifier PA; then, sending the amplified signals to form an electromagnetic field and receiving radio frequency signals fed back through a plurality of labels in the electromagnetic field by an antenna transmitting and receiving module with matched impedance;

amplifying the plurality of radio frequency signals fed back by the above labels by a power amplifier PA and then transmitting the signals to the RFID/UHF controller; identifying and confirming the plurality of radio frequency signals transmitted at the same time and then transmitting those radio frequency signals to the MCU via the communication interface by using the anti-collision programming algorithm in the controller;

encoding the plurality of label data fed back by the RFID/UHF controller and generating a baseband signal by the MCU; converting the generated baseband signal by the audio communication circuit into an audio analogue signal; and transmitting the audio analogue signal into the electronic device via a microphone channel in the audio interface;

transmitting the audio signal received in the audio interface of the electronic device into the built-in software module, and encoding the audio signal by the built-in software module to obtain the RFID/UHF label information read by the RFID/UHF controller.

2. The method for reading the RFID/UHF label based on the audio interface according to claim 1, therein the electronic device is a smart phone, a tablet PC or a PC machine with an audio interface.

3. A device for reading a radio frequency identification ultra-high frequency (RFID/UHF), label based on an audio frequency, comprising an audio communication circuit, a microcontroller (MCU), a RFID/UHF controller, a power amplifier and an antenna transmitting and receiving module; an audio communication circuit is connected with an audio interface of an electronic device; the audio communication circuit is connected with the RFID/UHF controller via the MCU; the power amplifier is located between the RIFD/UHF controller and the antenna transmitting and receiving module to amplify the signal; a plurality of communication channels are disposed between the RFID/UHF controller and the power amplifier;

the audio communication circuit is used for receiving an audio analogue signal generated by the electronic device and transmitted via a left/right earphone channel of the audio interface, and converts the received audio analogue signal into a digital signal;

the RFID/UHF controller is used for receiving the digital signal, modulating and transmitting signals of a plurality of different frequency points through an internal anti-collision programming algorithm, wherein the signal of every frequency point forms a signal channel;

the power amplifier is used for amplifying the signals of the above mentioned plurality of different frequency points, and then antenna transmitting and receiving module with the matched impedance sends the amplified signal;

the antenna transmitting and receiving module receives radio frequency signals fed back through a plurality of labels in the electromagnetic field, and the power amplifier amplifies and transmits the radio frequency signals to the RFID/UHF controller.

4. The device for reading the RFID/UHF label based on an audio interface according to claim 3, wherein the antenna transmitting and receiving module has a built-in impedance matching circuit.

5. The device for reading the RFID/UHF label based on an audio interface according to claim 4, wherein the audio communication circuit includes a first resistor, a first capacitor, a second resistor, a third resistor, a fourth resistor, a fifth resistor and a comparator;

one end of the first resistor is connected to the audio interface of the electronic device, while the other end of the first resistor is connected to one end of the first capacitor; the second resistor and the third resistor are connected in series between the positive electrode of an internal DC power source of the device and the ground, while the other end of the first capacitor is connected to the public end of the second resistor and third resistor and connected to an input end of the comparator;

the fourth resistor and the fifth resistor are connected in series between the positive electrode of the internal DC power source of the device and the ground, while the public point of the fourth resistor and fifth resistor is connected to the other input end of the comparator;

the output end of the comparator is connected to the MCU.

6. The device for reading the RFID/UHF label based on an audio interface according to claim 5, wherein the audio communication circuit also includes a first MOS tube, a second MOS tube, a first diode and a second diode;

the first MOS tube and the second MOS tube are N-channel MOS tubes;

the grid electrode of the first MOS tube is connected to the MIC signal wire of the audio interface of the electronic device, and the drain electrode of the first MOS tube is connected to the positive electrode of the first diode;

the grid electrode of the second MOS tube is connected to the MIC-GND signal wire of the audio interface of the electronic device, and the drain electrode of the second MOS tube is connected to the positive electrode of the second diode;

the negative electrodes of the first diode and the second diode are connected to the MCU;

the drain electrode of the first MOS tube is connected to the MIC-GND signal wire of the audio interface of the electronic device, and the drain electrode of the second MOS tube is connected to the MIC signal wire of the audio interface of the electronic device.

\* \* \* \* \*